US012650649B2

(12) United States Patent
Lin et al.

(10) Patent No.: US 12,650,649 B2
(45) Date of Patent: Jun. 9, 2026

(54) PHOTORESIST DEVELOPER AND METHODS OF USE

(71) Applicant: Taiwan Semiconductor Manufacturing Co., Ltd., Hsinchu (TW)

(72) Inventors: Tzu-Yang Lin, Hsinchu (TW); Chen-Yu Liu, Hsinchu (TW); Ching-Yu Chang, Hsinchu (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 399 days.

(21) Appl. No.: 17/584,173

(22) Filed: Jan. 25, 2022

(65) Prior Publication Data

US 2023/0056958 A1 Feb. 23, 2023

Related U.S. Application Data

(60) Provisional application No. 63/230,339, filed on Aug. 6, 2021.

(51) Int. Cl.

| | |
|---|---|
| ***G03F 7/004*** | (2006.01) |
| ***G03F 7/40*** | (2006.01) |
| ***H10P 76/20*** | (2026.01) |

(52) U.S. Cl.

CPC ............ *G03F 7/405* (2013.01); *G03F 7/0048* (2013.01); *H10P 76/2041* (2026.01)

(58) Field of Classification Search

CPC .......... G03F 7/325; G03F 7/0048; G03F 7/32; G03F 7/30

See application file for complete search history.

(56) References Cited

U.S. PATENT DOCUMENTS

| | | | | |
|---|---|---|---|---|
| 5,611,850 | A * | 3/1997 | Nishi | G03F 7/091 430/273.1 |
| 10,520,820 | B2 | 12/2019 | Liu et al. | |
| 2006/0024616 | A1* | 2/2006 | Clark | G03F 7/327 430/311 |
| 2008/0108723 | A1* | 5/2008 | Taniguchi | G03F 7/037 522/152 |
| 2014/0080066 | A1* | 3/2014 | Meya | H01L 21/0274 430/312 |
| 2016/0342091 | A1* | 11/2016 | Lin | G03F 7/38 |
| 2018/0341177 | A1* | 11/2018 | Liu | G03F 7/325 |

* cited by examiner

*Primary Examiner* — Daborah Chacko-Davis

(74) *Attorney, Agent, or Firm* — Seed IP Law Group

(57) ABSTRACT

Novel photoresist developing compositions including a deprotonation agent, such as a nitrogen containing organic base capable of deprotonating a surface of portions of a photoresist layer exposed to radiation.

20 Claims, 12 Drawing Sheets

PHOTORESIST DEVELOPER AND METHODS OF USE

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

Lithography processes are extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. The patterned resist layer is used as a masking element during subsequent IC processing, such as an etching process, where a resist pattern of the patterned resist layer is transferred to the workpiece. A quality of the resist pattern directly impacts a quality of the IC device. As IC technologies continually progress towards smaller technology nodes (for example, down to 14 nanometers, 10 nanometers, and below), resolution, roughness (for example, line edge roughness (LER) and/or line width roughness (LWR)), and/or contrast of the resist pattern has become critical. Multiple factors affect resolution, roughness, and/or contrast of the resist pattern, including the developer used for developing the exposed resist layer. Positive tone development (PTD) processes, which remove exposed portions of the resist layer, often use aqueous base developers, and negative tone development (NTD) processes, which remove unexposed portions of the resist layer, often use organic-based developers. While PTD processes can provide sufficient resist contrast, PTD processes can result in resist swelling that degrade LER and/or LWR. In contrast, while NTD processes typically minimize (or even eliminate) resist swelling issues, NTD processes provide insufficient resist contrast, degrading resolution. Accordingly, although existing lithography techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
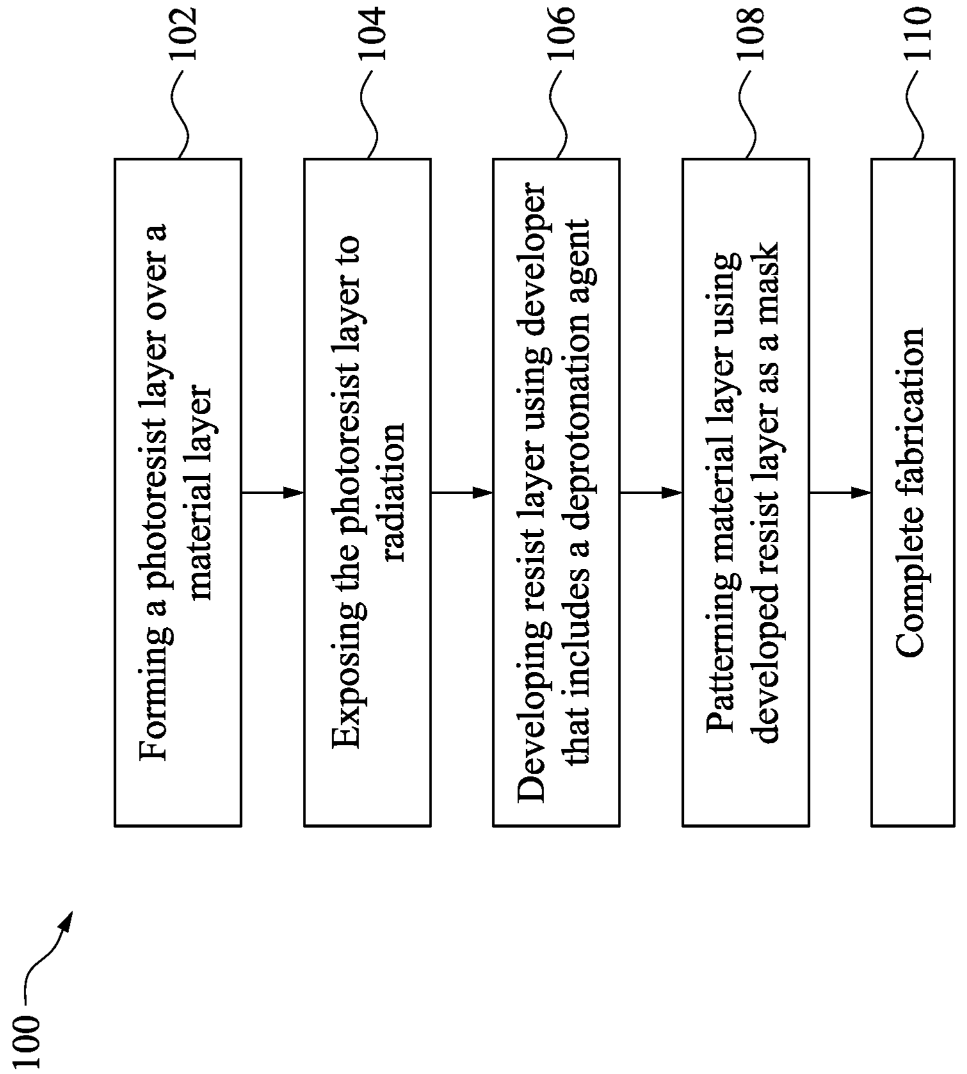
FIG. 1 is a flow chart of a lithography method for processing a workpiece according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 2A-2E and 5A-5D are diagrammatic fragmentary cross-sectional side views of a semiconductor device at various stages of fabrication in accordance with various aspects of the present disclosure. The semiconductor device may include an integrated circuit (IC) chip, system on chip (SoC), or portion thereof, and may include various passive and active microelectronic devices such as resistors, capacitors, inductors, diodes, metal-oxide semiconductor field effect transistors (MOSFET, for example, in the form of planar FETs, finFETs and nanosheet FETs), complementary metal-oxide semiconductor (CMOS) transistors, bipolar junction transistors (BJT), laterally diffused MOS (LDMOS) transistors, high power MOS transistors, or other types of transistors.

Extreme ultraviolet (EUV) lithography has become widely used due to its ability to achieve small semiconductor device sizes, for example, for 20 nanometer (nm) technology nodes or smaller. Solubility of an exposed or unexposed photoresist in a developer solution remains a challenge. Insufficient solubility of the photoresist in the developer solution can result in unsatisfactory pattern transfer to the workpiece. For example, the line edge roughness (LER), line width roughness (LWR), resolution (R)/LER/sensitivity (S) balance (RLS) and line critical dimension uniformity (LCDU) can be negatively impacted when the photoresist has unsatisfactory solubility in the developer solution. The drawbacks of such challenges are exacerbated with decreasing feature sizes.

A lithography process, e.g., an EUV lithography process, involves forming a resist layer over a workpiece and exposing the resist layer to patterned radiation. After exposure to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is then often used as a masking element during a subsequent process, such as an etching process or an implantation process, to transfer a pattern in the patterned resist layer (referred to herein as a resist pattern) to the workpiece. Advanced lithography materials, such as chemically amplified resist (CAR) materials, have been introduced to improve sensitivity of the resist layer to the radiation, thereby maximizing utilization of the radiation. Sensitivity (S) generally corresponds with an amount of incident radiation (amount of energy per unit area) required to produce sufficient chemical reactions to define a pattern in a resist layer. For example, CAR materials can generate multiple chemical reactions upon exposure to radiation, thereby chemically amplifying a response to the radiation, which reduces sensitivity (in other words, lower exposure doses are required for defining the pattern in the resist layer). CAR materials typically include a polymer that is resistant to an IC process (such as an etching process), an acid generating component (such as a photoacid generator (PAG)), and a solvent component. The PAG generates acid upon exposure to radiation, which functions as a catalyst for causing chemical reactions that decrease (or increase) solubility of exposed portions of a resist layer. For example, in some implementations, acid generated from the PAG catalyzes crosslinking of the polymer, thereby reducing solubility of the exposed portions.

While CAR materials are configured to minimize sensitivity, CAR materials must also satisfy other resist performance characteristics, in particular, resolution (R) and line edge roughness (LER). Resolution generally describes an ability of a resist material to print (image) a minimum feature size with acceptable quality and/or control, where resist contrast, resist thickness loss, proximity effects, swelling and/or contraction of the resist material (typically caused by development), and/or other resist characteristics and/or lithography characteristics contribute to the resolution. Resist contrast generally refers to an ability of a resist material to distinguish between light (exposed) regions and dark (unexposed) regions, where resist materials with higher contrasts provide better resolution, resist profiles, and/or LER. Roughness, such as LER and/or line width roughness (LWR), generally describes whether a pattern in a resist layer includes edge variations, width variations, critical dimension variations, and/or other variations. LER generally describes deviations in edges of a line, whereas LWR generally describes deviations of width of a line (for example, from critical dimension (CDU) width). Improving one resist performance characteristic (for example, reducing LER) often comes at the expense of degrading another resist performance characteristic (for example, increasing sensitivity), such that attempts at simultaneously minimizing resolution, LER, and sensitivity is referred to as RLS tradeoff. Overcoming the RLS tradeoff presents challenges to meeting lithography process demands for advanced technology nodes (for example, 14 nanometers, 10 nanometers, 5 nanometers, and below).

Extreme ultraviolet (EUV) lithography, which utilizes radiation having wavelengths in the EUV range, provides promise for meeting finer lithography resolution limits, particularly for sub-10 nm IC manufacturing. However, higher sensitivity CAR materials are often required at EUV wavelengths because exposure doses required for meeting resolution, contrast, and/or LER requirements, along with throughput requirements (such as wafers per hour (WPH)), are limited by conventional EUV sources. For example, since a number of photons absorbed by a volume of a resist material is proportional to wavelength and an amount of absorbed energy is proportional to exposure dose, a total absorbed energy is discretized into fewer photons as wavelength decreases. It has thus been observed that a volume of resist material absorbs fewer EUV photons than DUV photons (such as ArF photons) when exposed to the same exposure dose (for example, about 10 $mJ/cm^2$), which often means that less acid will be generated by CAR materials for catalyzing reactions. In some cases, the volume of resist material absorbs as much as 14 times fewer EUV photons. Such phenomenon is generally referred to as shot noise. Though increasing EUV exposure dose can alleviate the shot noise, thereby improving resolution, contrast, and/or roughness, such is achieved by increasing EUV source power or decreasing scan speed (in other words, decreasing throughput, such as wafers per hour (WPH)). Since current EUV sources are limited to EUV source power of about 80 W and decreasing throughput is not a viable option for meeting next generation IC manufacturing requirements, the developing process is currently being explored for improving sensitivity of CAR resist materials while still meeting other RLS characteristics, such as resolution and LER.

There are generally two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. PTD developers are typically aqueous base developers, such as tetraalkylammonium hydroxide (TMAH), and NTD developers are typically organic-based developers, containing organic compounds such as n-butyl acetate (n-BA). Both PTD processes and NTD processes have drawbacks when attempting to meet lithography resolution demands for advanced technology nodes. For example, both PTD processes and NTD processes (particularly those using NTD developers that include n-BA solvents) have been observed to cause resist pattern swelling, leading to insufficient contrast between exposed portions and unexposed portions of the resist layer (in other words, poor resist contrast) and resulting in higher than desired LER/LWR and/or low patterning fidelity. However, because NTD processes typically provide better normalized image log-slope (NILS) than PTD processes, NTD processes have become the focus for improving resolution for advanced technology nodes. It has been observed that NTD processes can generate electrostatic charges on metallic equipment, such as pumps or conduits the NTD flows across during the NTD process. Depending on when such electrostatic charges are discharged, damage to the metallic equipment or damage to features on the workpiece can occur. The present disclosure explores NTD developers and corresponding lithography techniques that can improve sensitivity of CAR materials (specifically, reducing an amount of exposure dosage required) to EUV radiation without degrading resolution and roughness, thereby overcoming the RLS tradeoff and achieving high patterning fidelity for advanced technology nodes. In addition, the present disclosure explores solutions to the generation of electrostatic charges on metallic equipment the NTD flows across.

The present disclosure provides a novel approach to address the photoresist solubility challenge as well as other challenges. For example, some embodiments of the present disclosure help to counter buildup of electrostatic charges on equipment the NTD comes into contact with, such as pumps or metallic conduits. The various aspects of the present disclosure will be discussed below in greater detail with reference to FIGS. 1-5.

FIG. 1 is a flow chart of a lithography method 100 for processing a workpiece (for example, a substrate) according to various embodiments of the present disclosure. In some implementations, method 100 is implemented, in whole or in part, by a system employing advanced lithography processes, such as DUV lithography, EUV lithography, e-beam lithography, x-ray lithography, and/or other lithography to enhance lithography resolution. At block 102, a resist layer is formed over a material layer of a workpiece. In some implementations, the resist layer is a negative tone resist layer, and the material layer is a portion of a wafer (or substrate). In other embodiments, the resist layer is a positive tone resist that can be developed with a negative developer. At block 104, the resist layer is exposed to radiation, for example, patterned radiation. In some implementations, the resist layer is exposed to patterned EUV radiation. In some implementations, after exposure, in some embodiments, the resist layer is baked, for example, by a post exposure baking process. At block 106, the resist layer is developed using a developer having an organic solvent that includes a deprotonation agent, which when contacted with exposed portions of the resist layer, causes the solubility of the exposed portions of the resist layer in the developer to decrease. Development of the photoresist layer forms a patterned resist layer.

In some embodiments, the organic solvent of the developer has a log P value greater than 1.82. In some embodiments, the organic solvent can be an ester acetate derivative represented by $R_1COOR_2$, where $R_1$ and $R_2$ are hydrocarbon chains having four or less carbon atoms. In some implementations, $R_1$, $R_2$, or both $R_1$ and $R_2$ are propyl functional groups. In some implementations, $R_1$ is n-propyl and $R_2$ is isopropyl. In some implementations, $R_1$ is isopropyl and $R_2$ is n-propyl. In some implementations, $R_1$ is ethyl and $R_2$ is 2-methylpropyl. The developer removes unexposed portions of the resist layer.

At block 108, a fabrication process is performed to the material layer of the workpiece using the patterned resist layer as a mask. For example, the material layer is patterned using the patterned resist layer as a mask. In some implementations, the material layer is etched, such that the material layer includes a pattern corresponding with a pattern of the patterned resist layer. In some implementations, doped regions are formed in the material layer, such that the material layer includes doped regions having a pattern corresponding with a pattern of the patterned resist layer. At block 110, method 100 can proceed with completing fabrication of the workpiece. Additional steps can be provided before, during, and after method 100, and some of the steps described can be moved, replaced, or eliminated for additional embodiments of method 100.

FIGS. 2A-2E are fragmentary cross-sectional views of a workpiece 200, in portion or entirety, at various fabrication stages (such as those associated with lithography method 100) according to various aspects of the present disclosure. Workpiece 200 is depicted at an intermediate stage of fabrication (or processing) of an IC device, such as a microprocessor, a memory, and/or other IC device. In some implementations, workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), nanostructure transistors, other suitable IC components, or combinations thereof. FIGS. 2A-2E have been simplified for the sake of clarity to better understand the inventive concepts of the present disclosure. Additional features can be added in workpiece 200, and some of the features described below can be replaced, modified, or eliminated in other embodiments of workpiece 200.

Figure 2A:
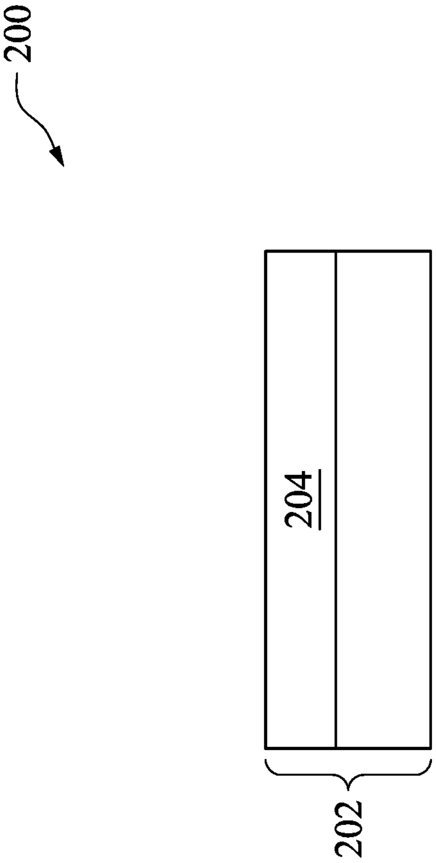
FIGS. 2A-2E are fragmentary cross-sectional views of a workpiece, in portion or entirety, at various fabrication stages (such as those associated with the lithography method of FIG. 1) according to various aspects of the present disclosure.

In FIG. 2A, workpiece 200 includes a wafer 202, which includes a substrate (for example, a semiconductor substrate), a mask (also referred to as a photomask or reticle), or any base material on which processing may be conducted to provide layers of material to form various features of an IC device. Depending on IC fabrication stage, wafer 202 includes various material layers (for example, dielectric layers, semiconductor layers, and/or conductive layers) configured to form IC features (for example, doped regions/features, isolation features, gate features, source/drain features (including epitaxial source/drain features), interconnect features, other features, or combinations thereof). In the depicted embodiment, wafer 202 includes a semiconductor substrate, such as a silicon substrate. Alternatively or additionally, wafer 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, wafer 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, where workpiece 200 is fabricated into a mask for patterning IC devices, wafer 202 can be a mask substrate that includes a transparent material (for example, calcium fluoride ($CaF_2$)) or a low thermal expansion material (for example, fused quartz, $TiO_2$ doped $SiO_2$, or other suitable low thermal expansion materials).

A material layer 204 to be processed (also referred to herein as an underlying layer) is disposed over wafer 202. However, the present disclosure contemplates implementations where material layer 204 is omitted, such that wafer 202 is directly processed. In some implementations, material layer 204 includes a conductive material or a semiconductor material, such as metal or metal alloy. In some implementations, the metal includes titanium (Ti), aluminum (Al), tungsten (W), tantalum (Ta), copper (Cu), cobalt (Co), ruthenium (Ru), other suitable metal, or combinations thereof. In some implementations, the metal alloy includes metal nitride, metal sulfide, metal selenide, metal oxide, metal silicide, other suitable metal alloy, or combinations thereof. In such implementations, the metal alloy can be represented by a formula $MX_a$, where M is a metal and X is selected from the group consisting of nitrogen (N), sulfur (S), selenide (Se), oxygen (O), and silicon (Si). In some implementations, a is about 0.4 to about 2.5. For example, in some implementations, material layer 204 includes titanium nitride (TiN), tungsten nitride ($WN_2$), or tantalum nitride (TaN). Alternatively, in some implementations, material layer 204 includes a dielectric material, such as silicon oxide ($SiO_2$), silicon nitride (SiN), metal oxide, or metal nitride. In such implementations, a material of material layer 204 can be represented by a formula $MX_b$, where M is a metal (for example, Al, hafnium (Hf), or lanthanum (La)) or Si and X is N, O, and/or carbon (C). In some implementations, b is about 0.4 to about 2.5. For example, in some implementations, material layer 204 includes $SiO_2$, SiN, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$). In some implementations, the dielectric material has a dielectric constant (k) of about 1 to about 40, such that the dielectric material can be a low-k dielectric material or a high-k dielectric material depending on IC design requirements. In some implementations, material layer 204 is a hard mask layer to be patterned for use in subsequent processing of workpiece 200. In some implementations, material layer 204 is an anti-reflective coating (ARC) layer. In some implementations, material layer 204 is a layer to be used for forming a gate feature (for example, a gate dielectric and/or a gate electrode), a source/drain feature (for example, an epitaxial source/drain), and/or a contact feature (for example, a conductive or dielectric feature of a multilayer interconnect (MLI)) of workpiece 200. In some implementations, where workpiece 200 is fabricated into a mask for patterning IC devices, material layer 204 is a layer to be processed to form an IC pattern therein, such as an absorber layer (including, for example, chromium) or a reflective layer (including, for example, multiple layers formed on wafer 202, where the multiple layers include a plurality of film pairs, such as molybdenum-silicide (Mo/Si) film pairs, molybdenum-beryllium (Mo/Be) film pairs, or other suitable material film pairs configured for reflecting radiation).

Figure 2B:
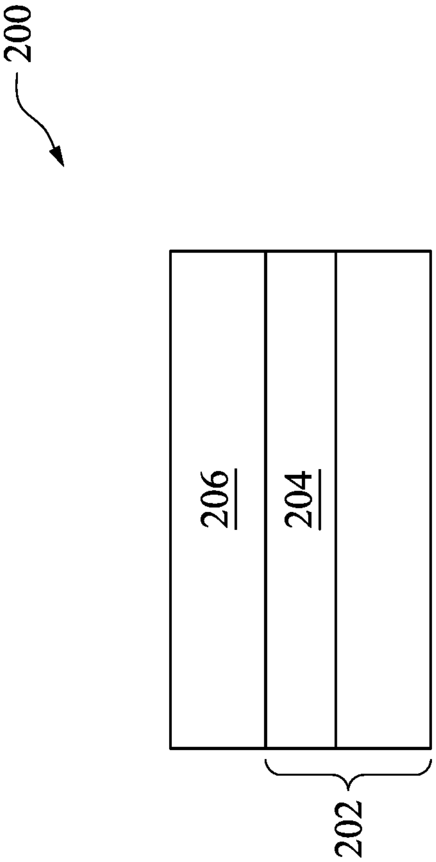

In FIG. 2B, a resist layer 206 is formed over wafer 202 by any suitable process. Resist layer 206 is also referred to as a photoresist layer, photosensitive layer, imaging layer, patterning layer, or radiation sensitive layer. Resist layer 206 is sensitive to radiation used during a lithography exposure process, such as DUV radiation, EUV radiation, e-beam radiation, ion beam radiation, and/or other suitable radiation. In the depicted embodiment, resist layer 206 includes a material sensitive to EUV radiation. In some implementations, resist layer 206 is formed by spin coating a liquid resist material onto a material layer to be processed, such as material layer 204. After spin coating the liquid resist material (but before performing an exposure process), a pre-bake process can be performed on resist layer 206, for example, to evaporate solvent and to densify the liquid resist material formed over material layer 204. In some implementations, before forming resist layer 206, an ARC layer is formed over material layer 204, such that resist layer 206 is formed over the ARC layer. The ARC layer may be a nitrogen-free ARC (NFARC) layer that includes a material such as $SiO_2$, silicon oxygen carbide (SOC), plasma enhanced chemical vapor deposited silicon oxide (PECVD-$SiO_2$), other suitable material, or combinations thereof. In some implementations, more than one layer (including one or more ARC layers) can be formed between material layer 204 and resist layer 206.

In some embodiments, the resist layer 206 includes a chemically amplified resist (CAR) material. For purposes of the following discussion, resist layer 206 includes a negative tone material (and is thus also referred to as a negative tone resist layer), where portions of resist layer 206 exposed to radiation become insoluble (or exhibit reduced solubility) to a developer and unexposed portions of resist layer 206 remain soluble to the developer. Alternatively, the present disclosure contemplates implementations where resist layer 206 includes a positive tone resist material (and is thus referred to as a positive tone resist layer), where portions of resist layer 206 exposed to radiation become soluble to a developer and unexposed portions of resist layer 206 remain insoluble to the developer. In some embodiments the resist layer comprises a photoresist that can be developed using a negative developer, e.g., an organic solvent. In some implementations, the CAR material includes a polymer and/or other suitable resist components mixed in a solvent, which are configured to provide the negative tone material (in the depicted embodiment) or the positive tone material (in alternate embodiments). The other resist components can include a photo acid generator (PAG) component, a thermal acid generator (TAG) component, an acid labile group (ALG) component, a quencher component, a photo-decomposable base (PDB) component, a chromophore component, a cross-linker component, a surfactant component, and/or other suitable component depending on requirements of the CAR material. In some implementations, the CAR resist material includes the PAG component, which generates acid upon absorbing radiation. In the depicted embodiment, where resist layer 206 is a negative tone resist layer, acid generated from the PAG component catalyzes cross-linking of polymer in the CAR resist material and/or suppressing reactions of other resist components (such as ALG components) with polymer in the CAR resist material, changing characteristics (for example, polarity and/or solubility) of exposed portions of resist layer 206. For example, when resist layer 206 is exposed with radiation reaching a defined exposure dose threshold, exposed portions of resist layer 206 exhibit decreased solubility (and/or increased hydrophilicity) in a negative developer, such as an organic based solvent. In such embodiments, the pattern defined by the portions of the mask or reticle through which radiation is transmitted remain after a photoresist developing process. In other embodiments, when resist layer 206 is exposed with radiation reaching a defined exposure dose threshold, exposed portions of resist layer 206 exhibit increased solubility in a developer, e.g., TMAH. In such embodiments, the pattern defined by the portions of the mask or reticle through which radiation is transmitted radiation are removed during a photoresist developing process. In some implementations, the CAR resist material includes poly(hydroxystyrene) (PHS), methacrylate polymers, or a PHS/methacrylate hybrid polymers. In some implementations, where the CAR resist material is a PHS resist material, the PHS resist material includes less than about 40% PHS, but greater than 0%. The PHS resist material can include PHS polymer, which may be a part of a copolymer in the PHS resist material or blended with another polymer to form a PHS resist layer. In some implementations, the CAR resist material, such as the PHS resist material includes one or more hydroxybenzyl groups or benzyl groups.

Figure 2C:
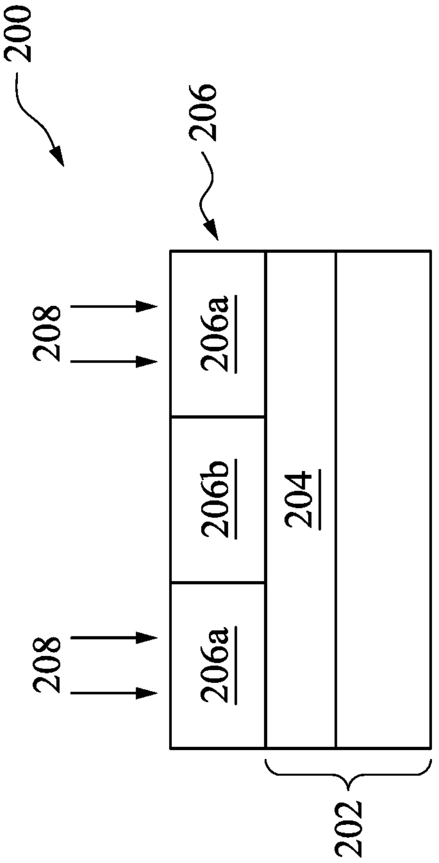

In FIG. 2C, an exposure process is performed on resist layer 206, where resist layer 206 is illuminated with patterned radiation 208. In some implementations, resist layer 206 is exposed to patterned radiation 208 having a wavelength less than about 250 nm, such as DUV radiation (for example, 248 nm radiation from a KrF laser or 193 nm radiation from an ArF laser), EUV radiation, x-ray radiation, e-beam radiation, ion-beam radiation, and/or other suitable radiation. In the depicted embodiment, resist layer 206 is exposed to EUV radiation, which generally refers to radiation having a wavelength of about 1 nm to about 100 nm. In some implementations, the EUV radiation has a wavelength of about 10 nm to about 15 nm (for example, about 13.5 nm). The exposure process can be in air, liquid (immersion lithography), or vacuum (for example, when implementing EUV lithography and/or e-beam lithography). In some implementations, the radiation is patterned using a mask having an IC pattern defined therein, such that the patterned radiation forms an image of the IC pattern on resist layer 206. The mask transmits, absorbs, and/or reflects the radiation depending on the IC pattern, along with mask technologies used to fabricate the mask. Various resolution enhancement techniques, such as phase-shifting, off-axis illumination (OAI), and/or optical proximity correction (OPC), may be implemented through the mask or the exposing process. For example, OPC features may be incorporated into the IC pattern. In another example, the mask is a phase-shift mask, such as an alternative phase-shift mask, an attenuated phase-shift mask, or a chromeless phase-shift mask. In yet another example, the exposing process is implemented in an OAI mode. In some implementations, the radiation beam is patterned by directly modulating the radiation beam according to an IC pattern without using a mask (often referred to as maskless lithography).

A latent pattern is formed on resist layer 206 by the exposure process. The latent pattern generally refers to a pattern exposed on the resist layer, which eventually becomes a physical resist pattern when the resist layer is subjected to a developing process. The latent pattern can include exposed portions 206*a* and unexposed portions 206*b* (which, in some implementations, includes both unexposed portions and under-exposed portions of resist layer 206). In the depicted embodiment, exposed portions 206*a* physically and/or chemically change in response to the exposure process. For example, PAG components in exposed portions 206*a* of resist layer 206 generate acid upon absorbing radiation, which functions as a catalyst for causing chemical reactions that decrease (or increase) solubility of exposed portions 206*a*. For example, acid generated from the PAG components catalyzes cross-linking of polymer and/or suppressing reactions of other resist components (such as ALG components) with polymer in exposed portions 206*a* of resist layer 206, thereby chemically changing exposed portions 206*a*. In some implementations, the radiation activates photoactive compounds in the photoresist which cause the exposed portions to become more soluble in a developing solution than the unexposed portions. In some implementations, after the exposure process, a post-exposure baking (PEB) process is performed on resist layer 206, which can affect the cross-linking of polymer and/or suppression of reactions of other resist components with the polymer. For example, in some embodiments, the exposure process and/or the PEB process decrease hydrophilicity of exposed portions 206*a* (in other words, the polymers become more hydrophobic), decreasing solubility of exposed portions 206*a* to a developer, for example, an aqueous based developer. Alternatively, in some implementations, the exposure process and/or the PEB process increase hydrophilicity of exposed portions 206*a* (in other words, the polymers become more hydrophilic), increasing solubility of exposed portions 206*a* to a developer, e.g., an aqueous based developer such as a developer containing TMAH. In some embodiments, the exposure process and/or the PEB process decrease hydrophilicity of exposed portions 206*a* (in other words, the polymers become more hydrophobic), increasing solubility of exposed portions 206*a* to a developer, for example, an organic based developer. Alternatively, in some implementations, the exposure process and/or the PEB process increase hydrophilicity of exposed portions 206*a* (in other words, the polymers become less hydrophobic), decreasing the solubility of exposed portions 206*a* to a developer, e.g., organic based developer.

Figure 2D:
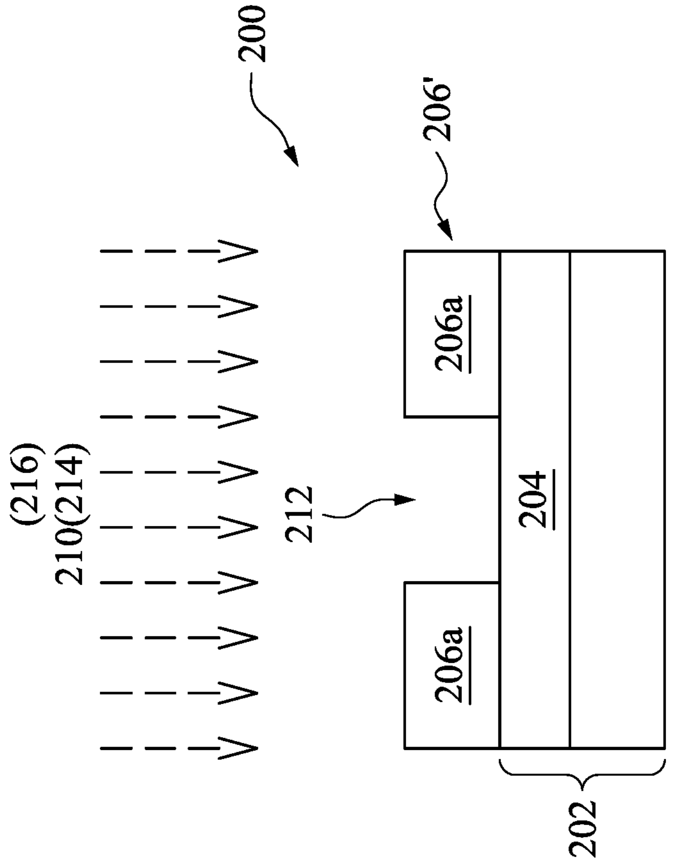

In FIG. 2D, a developing process is performed on resist layer 206, thereby forming patterned resist layer 206'. In the depicted embodiment, a negative tone development (NTD) process is performed to remove unexposed portions 206*b* of resist layer 206. For example, an NTD developer 210 is applied to resist layer 206 that dissolves unexposed portions 206*b*, leaving patterned resist layer 206' having opening(s) 212 defined therein between exposed portions 206*a* (collectively referred to as a resist pattern). In some implementations, a rinsing process is performed after the developing process, for example, to remove any residue and/or particles from workpiece 200. In some implementations, a post-development baking (PDB) process is performed, for example, to ensure structural stability of patterned resist layer 206'.

In accordance with embodiments described herein, developer 210 includes a new and improved composition that overcomes RLS tradeoff barriers discussed herein, particularly those associated with EUV lithography, providing improved patterning fidelity. Developer 210 in accordance with embodiments of the present disclosure includes an organic solvent 214 and a deprotonation agent 216. Examples of organic solvent 214 include n-butyl acetate (n-BA), aliphatic ketones or high density alcohols, such as methyl isobutyl carbinol (MIBC).

A specific example of an organic solvent 214 includes an ester acetate derivative having a log P value greater than 1.82. For example, organic solvent 214 is represented by $R_1COOR_2$, where $R_1$ and $R_2$ are hydrocarbon chains having four or less carbon atoms. In some implementations, organic solvent 214 is represented by formula (I):

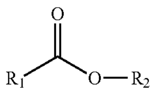

(I)

where $R_1$, $R_2$, or both $R_1$ and $R_2$ are propyl functional groups. In some implementations, $R_1$ is ethyl and $R_2$ is 2-methylpropyl (also referred to as isobutyl), such that organic solvent 214 is represented by the formula (II):

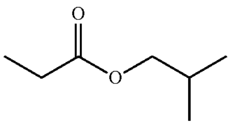

(II)

In some implementations, $R_1$ is isopropyl and $R_2$ is n-propyl, such that organic solvent 214 is represented by formula (III):

(III)

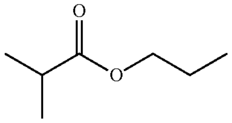

In some implementations, $R_1$ is n-propyl and $R_2$ is isopropyl, such that organic solvent 214 is represented by formula (IV):

(IV)

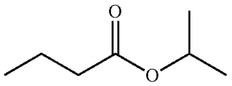

In some implementations, $R_1$ and $R_2$ are selected to balance hydrophobicity and hydrophilicity of developer 210, e.g., a negative tone developer, such that organic solvent 214 has a log P value greater than 1.82. For example, in some implementations, $R_1$ and $R_2$ are not polar functional groups. In some implementations, developer 210 further includes another organic solvent, such as n-butyl acetate (n-BA), such that NTD developer 210 includes co-solvents. A ratio between organic solvent 214 and n-BA is determined by characteristics of resist layer 206, such as desired solubility, molecular weights of the polymer, PAG, and/or other resist components, molecular weight dispersity, polarity of monomers, monomer sequences, other suitable resist characteristics, or combinations thereof. In some implementations, developer 210 further includes additives, surfactants, and/or other suitable developer components.

Developer 210 in accordance with embodiments of the present disclosure includes a deprotonation agent 216. As described in more detail below, contacting the exposed portion **206*a* with the combination of the organic solvent 214 and deprotonation agent 216 results in an increase in hydrophilicity of the exposed portions of photoresist 206*a*, thereby rendering the exposed portions of photoresist 206*a* less penetrable by the organic components of the NTD developer, while not changing the hydrophilicity of the unexposed portions 206*b*. This difference in the susceptibility of the exposed portions of photoresist 206*a* and the susceptibility of the unexposed portions of photoresist 206*b* to penetration by the organic solvent of the NTD results in a reduced amount or no swelling of exposed portions 206*a*. Opening(s) 212 are thus defined by relatively smooth edges and/or sidewalls of exposed portions 206*a*, such that the resist pattern of patterned resist layer 206' exhibits minimal LER/LWR and improved resist contrast, significantly enhancing lithography resolution. The improved LER/LWR and resist contrast is achieved at lower exposure dosages, such as those achievable by current EUV technologies. NTD developer 210 having organic solvent 214 and deprotonation agent 216 thus improves sensitivity of resist layer 206 without sacrificing resolution and/or LER/LWR, thereby breaking the RLS tradeoff. Accordingly, NTD developer 210** in accordance with the present embodiments is particularly useful for EUV lithography, the target lithography technology for sub-10 nanometer IC fabrication, which typically requires higher sensitivity. Different embodiments disclosed herein offer different advantages and no particular advantage is necessarily required in all embodiments.

NTD developer 210 performs superior to conventional NTD developers including n-BA solvents and/or derivatives thereof, which dissolve resist materials too easily and/or penetrate exposed portions of resist materials (thereby increasing LER and/or pattern deformation).

Figure 2E:
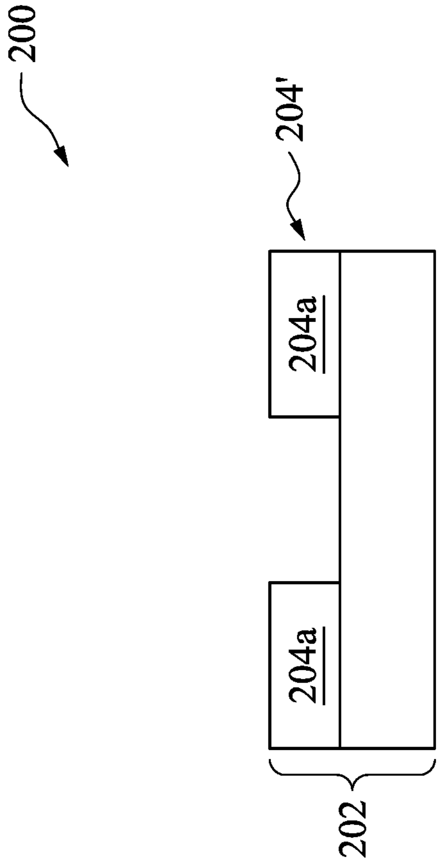

Turning to FIG. 2E, a fabrication process is performed on workpiece 200, such as material layer 204 and/or wafer 202, using patterned resist layer 206' as a mask. For example, the fabrication process is applied only to portions of workpiece 200 within opening(s) 212 of patterned resist layer 206', while other portions of workpiece 200 covered by patterned resist layer 206' are protected from being impacted by the fabrication process. In some implementations, the fabrication process includes performing an etching process on material layer 204 using patterned resist layer 206' as an etching mask. A pattern is thus transferred from patterned resist layer 206' to material layer 204, thereby forming patterned material layer 204'. In implementations where material layer 204 is a hard mask layer (or other type of patterning layer), the pattern is first transferred from patterned resist layer 206' to material layer 204, and then the pattern is transferred from patterned material layer 204' to a material layer of wafer 202. The etching process includes a dry etching process, a wet etching process, other suitable etching process, or combinations thereof. Alternatively, in some implementations, the fabrication process includes performing an implantation process on material layer 204 using patterned resist layer 206' as an implant mask, thereby forming various doped features (regions) in material layer 204. Thereafter, as depicted in FIG. 2E, patterned resist layer 206' is removed from workpiece 200 using any suitable process, such as a resist stripping process, leaving patterned material layer 204' disposed over wafer 202. In some implementations, patterned resist layer 206' may be partially consumed during the fabrication process, such as during the etching process, such that any remaining portion of patterned resist layer 206' is subsequently removed by the resist stripping process. It is noted that the present disclosure also contemplates implementations where instead of patterning material layer 204, a deposition process is performed to fill opening(s) 212 of patterned resist layer 206' with a material, thereby forming IC features over material layer 204 (for example, conductive material lines).

It is understood that additional processes may be performed before, during, or after the steps described above with respect to FIG. 2E to complete the fabrication of the semiconductor device. For example, the exposure process discussed herein may be done using a radiation having a first wavelength, and the photoresist may later be exposed by a radiation having a second wavelength (e.g., as a part of a double patterning process). For reasons of simplicity, these additional steps are not discussed herein in detail.

Figure 3:
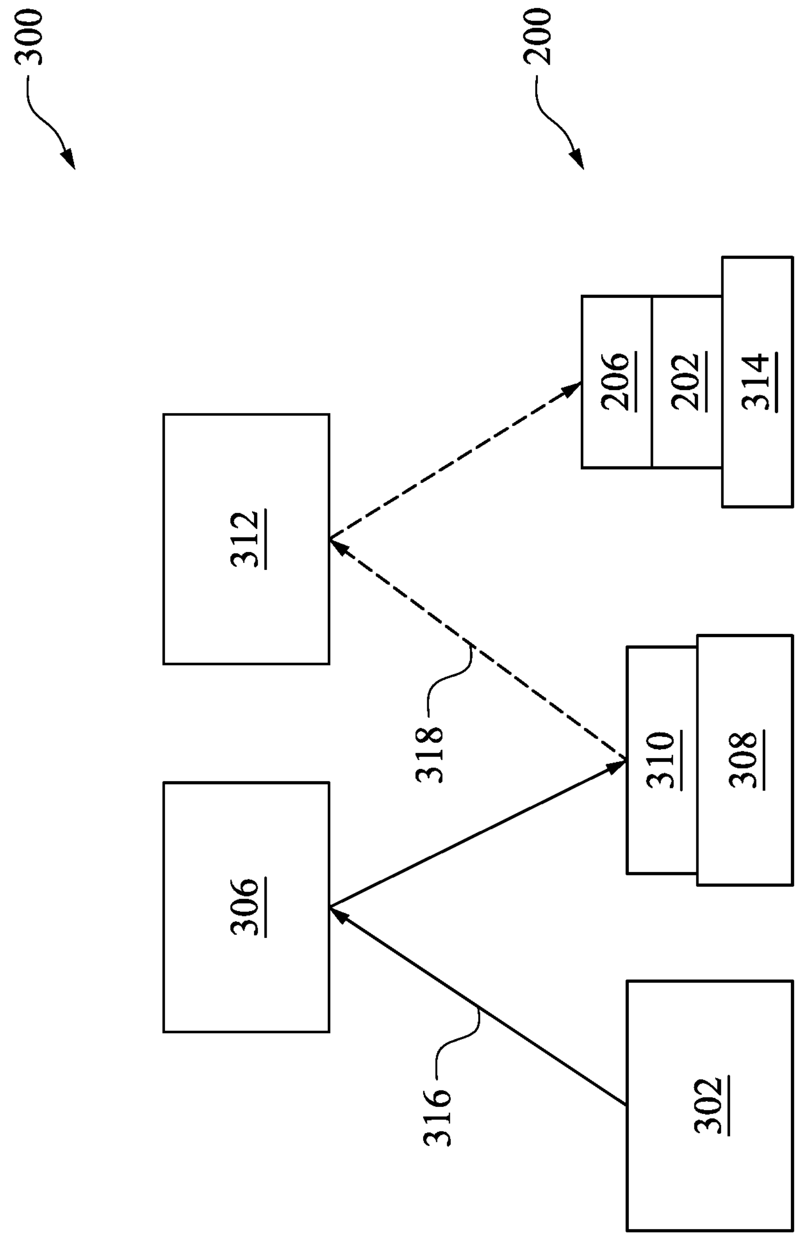
FIG. 3 is a simplified block diagram of a lithography system that can be implemented for exposing processes, such as those associated with the lithography method of FIG. 1, according to various aspects of the present disclosure.
Figure 4:
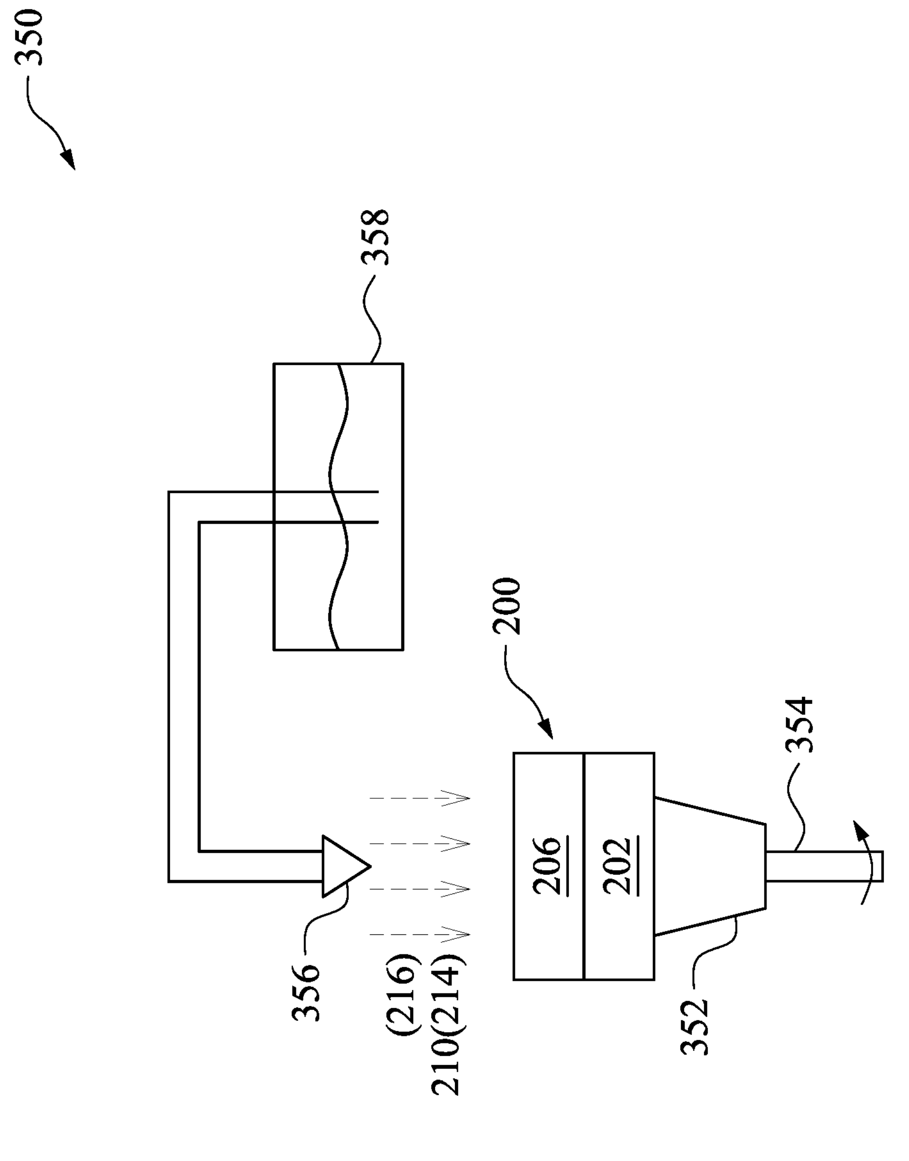
FIG. 4 is a simplified block diagram of a development system that can be implemented for developing processes, such as those associated with the lithography method of FIG. 1, according to various aspects of the present disclosure.

FIG. 3 is a simplified block diagram of a lithography system that can be implemented for exposing processes, such as those associated with the lithography method of FIG. 1, according to various aspects of the present disclosure. Lithography system 300 includes an illumination source 302, illumination optics 306, a mask stage 308 having a mask 310 secured thereon, projection optics 312, and a wafer stage 314 having a workpiece, such as workpiece 200, secured thereon. Illumination source 302 emits radiation 316 having wavelengths in the EUV range, such as from about 1 nm to about 100 nm. In some implementations, illumination source 302 emits EUV radiation having a wavelength of about 13.5 nm. Illumination optics 306 collect, guide, and direct radiation 316 emitted by illumination source 302 to mask 310. Mask stage 308 provides control of a position of mask 310 within lithography system 300 during alignment, focus, leveling, and/or exposure operations. Mask 310 includes an IC pattern, which is used for fabricating one or more IC features and/or devices on workpiece 200. Mask 310 transmits, absorbs, and/or reflects radiation 316 depending on a final mask pattern of mask 310, along with mask technologies used to fabricate mask 310, thereby providing patterned radiation 318. Projection optics 312 collect, guide, and direct patterned radiation 318 to workpiece 200, such that an image of mask 310 is projected onto workpiece 200. In some implementations, projection optics 312 can reduce an image of mask 310 provided by patterned radiation 318 (for example, by implanting optics having a magnification of less than one). Illumination optics 306 and projection optics 312 include refractive optics (such as one or more lenses), reflective optics (such as one or more mirrors), and/or any other illumination/projection components for facilitating illumination optics 306 and projection optics 312 in collecting, guiding, and directing radiation from illumination source 302 to workpiece 200. Workpiece 200 includes wafer 202 having a radiation sensitive layer (in particular, resist layer 206) disposed thereover, where portions of the radiation sensitive layer exposed to the radiation chemically change (for example, become insoluble to a developer, such as NTD developer 210). Wafer stage 314 provides control of a position of workpiece 200 within lithography system 300 during alignment, focus, leveling, and/or exposure operations, such that an image of mask 310 can be scanned or stepped onto workpiece 200 in a repetitive fashion (though other lithography methods are possible). Lithography system 300 can include additional features depending on implemented lithography process technologies. FIG. 4 has been simplified for the sake of clarity to better understand the inventive concepts of the present disclosure. Additional features can be added in lithography system 300, and some of the features described below can be replaced or eliminated for additional embodiments of lithography system 300.

In some implementations, developer 210 is applied to workpiece 200 in a development tool. FIG. 4 is a simplified block diagram of a development system 350 (also referred to as a development tool or a development apparatus) that can be implemented for developing resist layer 206 according to various aspects of the present disclosure. Development system 350 includes a wafer stage 352 having a workpiece, such as workpiece 200, secured thereon, for example, by a vacuum mechanism, e-chucking, or other suitable mechanism. A motion mechanism 354 integrated with wafer stage 352 is operable to drive wafer stage 352, such that wafer stage 352 is operable to spin workpiece 200 during a developing process. In some implementations, motion mechanism 354 includes a motor to drive wafer stage 352 to spin at various speeds depending on processing stage, such as a first speed during a developing process and a second speed during a rinsing process. In some implementations, motion mechanism 354 includes an elevation system configured to move wafer stage 352 along a vertical direction and/or horizontal direction, such that workpiece 200 can be positioned at different levels within development system 350. A nozzle 356 delivers a developer, such as NTD developer 210, to workpiece 200. In some implementations, nozzle 356 dispenses NTD developer 210 while workpiece 200 is spun by wafer stage 352. The developer, such as NTD developer 210, can be stored in a container 358, where NTD developer 210 is delivered to nozzle 356 via a delivery system (for example, having a pump, a pressurized gas, or other mechanism configured to deliver the developer via one or more pipelines to nozzle 356). As described fully above, NTD developer 210 includes organic solvent 214. In some implementations, NTD developer 210 includes n-BA as a co-solvent. In such embodiments, organic solvent 214 and n-BA may be pre-mixed and stored in container 358. Alternatively, organic solvent 214 and n-BA may be stored in separate containers (similar to container 358) and mixed through the delivery system as NTD developer 210 is applied to workpiece 200. In some implementations, developing system 350 can control a mixing ratio between organic solvent 214 and n-BA, which may depend on various physical values related to parameters of resist layer 206. In some implementations, developing tool 350 applies NTD developer 210 in a spin-on process, for example, by spraying NTD developer 210 onto resist layer 206 while spinning workpiece 200. In some implementations, NTD developer 210 is continuously sprayed onto workpiece 200. Alternatively, in some implementations, NTD developer 210 is applied by other means, such as a puddle process. In some implementations, developing system 350 is part of a cluster tool in an IC fabrication process. For example, after resist layer 206 has been exposed in lithography system 300, workpiece 200 is transferred to developing system 350, which applies NTD developer 210 to resist layer 206, thereby forming patterned resist layer 206'. Development system 350 can include additional features depending on implemented lithography process technologies. FIG. 4 has been simplified for the sake of clarity to better understand the inventive concepts of the present disclosure. Additional features can be added in development system 350, and some of the features described below can be replaced or eliminated for additional embodiments of development system 350.

Figure 5A:
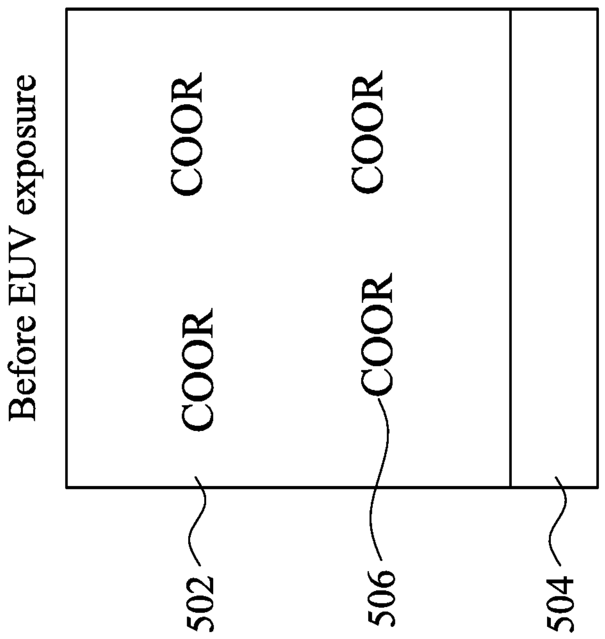
FIG. 5A-5D are fragmentary cross-sectional views of a workpiece, in portion or entirety, in various fabrication stages (such as those associated with the lithography method of FIG. 1) according to various aspects of the present disclosure.
Figure 5B:
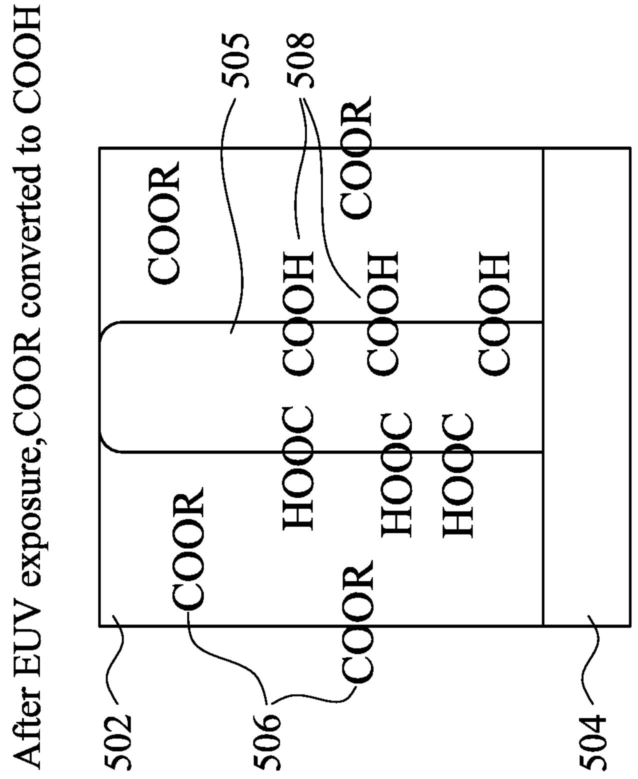
Figure 5C:
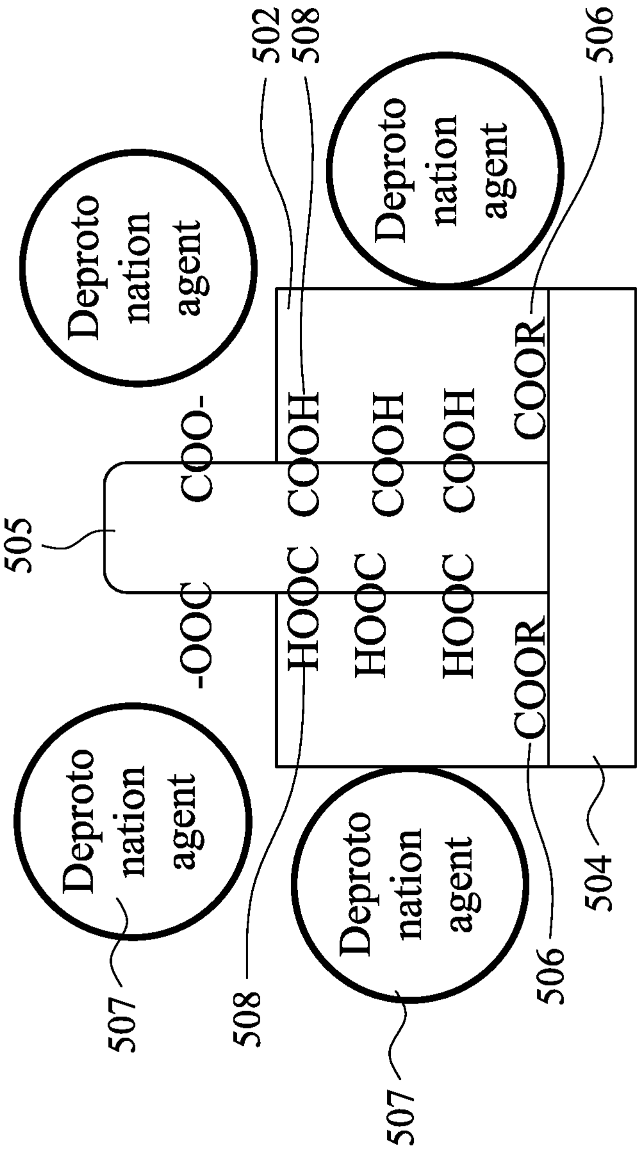

The present disclosure provides various lithography developer compositions and corresponding lithography techniques for improving lithography resolution and reducing energy requirements. Referring to FIG. 5A, an exemplary lithography method includes forming a resist layer 502 over a substrate 504. The resist layer includes a photoresist material which, prior to exposure to radiation, e.g., EUV radiation, includes multiple carboxylate functional groups (—COOR) 506. In FIG. 5B, after exposure to a pattern of EUV radiation, portions 505 of the photoresist 502 exposed to the EUV radiation have some of the carboxylate functional groups 506 converted to carboxylic acid functional groups (—COOH) 508. The carboxylic acid functional groups 508 are more hydrophilic than the carboxylate functional groups 506. Stated another way, the carboxylate functional groups 506 are more hydrophobic than the carboxylic acid functional groups 508. Accordingly, the unexposed portions of the photoresist 502 which include the carboxylate functional groups 506 are more readily penetrated and removed by the organic solvent of the developer compared to the exposed portions 505. Referring to FIG. 5C, as described above, a developer in accordance with embodiments of the present disclosure, includes a deprotonation agent 507 which is soluble in the organic solvent of the developer. The deprotonation agent is able to alter a surface of the exposed portions of the photoresist layer, e.g., deprotonate a COOH group. Deprotonating a COOH group results from disassociating a hydrogen ion from the carboxylic acid groups 508 of the exposed portions 505 of the photoresist 502 at temperatures at which photolithography processes are typically carried out, e.g., in the range of 20-30° C. The deprotonating agent is able to deprotonate the carboxylate groups in a period of time ranging between 5 to 300 seconds, so as not to unnecessarily impact the throughput of the photolithography process. When the developer is contacted with the exposed portions 505 of the photoresist 502 for less than five seconds, insufficient removal of the unexposed portions of photoresist 502 may occur. When the developer is contacted with the exposed portions 505 of the photoresist 502 for more than 300 seconds, unwanted portions of the exposed photoresist may be removed and the effect on the semiconductor process production rate may be negatively impacted. As illustrated in FIG. 5C, in accordance with embodiments of the present disclosure, portions 505 of the photoresist 502 which have been exposed to radiation are exposed to the deprotonating agent after the organic solvent of the developer has removed portions of the unexposed portions of the photoresist 502, thereby exposing portions 505 to the organic solvent and deprotonation agent of the developer.

Figure 5D:
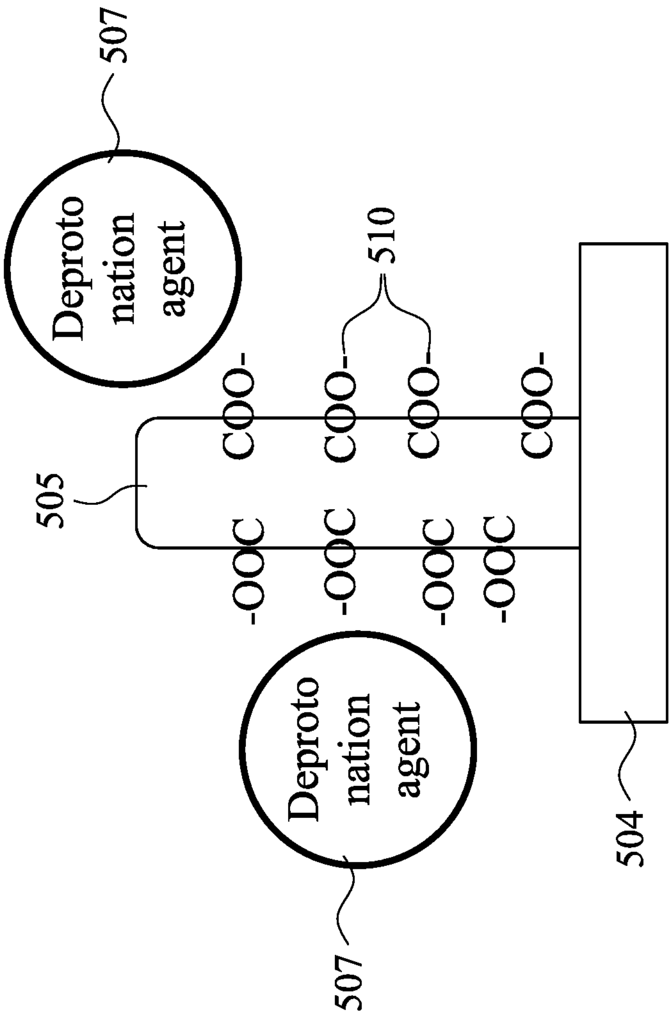

In some embodiments, a deprotonation agent that has a pKa in the range of 5 to 20 provides a desired level of deprotonation. Embodiments in accordance with the present disclosure are not limited to deprotonation agents having a pKa in the range of 5 to 20. In other embodiments, the deprotonation agent can have a pKa less than 5 or greater than 20 provided the deprotonation agent is capable of deprotonating carboxylic acid groups of the exposed portions 505 photoresist 502. FIG. 5D illustrates an intermediate structure of exposed photoresist feature 505 after deprotonation in accordance with embodiments of the present disclosure. The deprotonated carboxylic acid groups 510 are more hydrophilic than the carboxylic acid groups 508 prior to deprotonation. Thus, the exposed portion 505 of the photoresist 502 after it has been deprotonated is more resistant to penetration by the organic solvent of the developer compared to the exposed portion 505 of the photoresist 502 before deprotonation. Due to the effect of the deprotonation agent on the hydrophilicity of the exposed portions 505 of the photoresist 502, the deprotonation agent is also referred to a hydrophilicity affecting agent. This increased resistance of the deprotonated exposed portion 505 of the photoresist 502 contributes to an increase in development contrast achievable between the exposed portion 505 of the photoresist 502 and unexposed portions of the photoresist 502. This increased contrast contributes positively to the RLS tradeoff.

In some embodiments, the deprotonation agent 507 is a nitrogen-containing organic base. Examples of suitable nitrogen containing organic bases include pyridine, imidazole, benzimidazole, methylamine, histidine or methylethyl amine. Embodiments in accordance with the present disclosure are not limited to the foregoing nitrogen containing organic bases as deprotonation agent 507. Other organic bases may be used as a deprotonation agent 507 provided they are soluble in the organic solvent of the developer, are able to deprotonate a carboxylic acid of the exposed photoresist, and do not otherwise negatively impact the photolithography process or the photolithography equipment. As used herein soluble means the deprotonation agent is dissolved by the organic solvent of the developer sufficiently such that any undissolved deprotonation agent does not negatively impact the development of the photoresist 502. For example, in some embodiments up to 100% of the deprotonation agent in the developers of the present disclosure is dissolved by the organic solvent. In other embodiments, less than 100% of the deprotonation agent in the developer is dissolved by the organic solvent.

The amount of developer used to deprotonate the exposed portions 505 of the photoresist 502 can vary. In some embodiments, the amount of developer used ranges between 5 to 150 cubic centimeters per wafer. When less than 5 $cm^3$ of developer per wafer is used, insufficient wedding of the entire surface of the wafer may result. When more than 150 $cm^3$ per wafer of developer is used, excess developer may be employed and ultimately wasted.

In some embodiments, the deprotonation agent 507 comprises less than 10 weight % of the developer so as to reduce the likelihood that the presence of the deprotonation agent will cause leaching of stainless steel equipment the developer comes in contact with. Embodiments in accordance with the present disclosure are not limited to a developer that includes less than 10 weight percent of the deprotonation agent. Developers in accordance with other embodiments may include more than 10 weight percent of the deprotonation agent, provided the deprotonation agent is able to deprotonate a sufficient number of the carboxylic acid groups of the exposed photoresist so as to increase the resistance of the exposed portions of the photoresist to penetration by the organic solvent of the developer and does not cause leaching of stainless steel equipment the developer comes in contact with.

In accordance with some embodiments of the present disclosure, methods and developer compositions in accordance with embodiments of the present disclosure are useful with photoresist layers having a thickness or height ranging between 20 to 100 nm. When the photoresist layer is less than 20 nm thick, insufficient photoresist may be present to cover other features on the surface to which the photoresist is applied which may result in incomplete or unacceptable patterning of photoresist and/or the surface to which the photoresist is applied. When the photoresist layer is greater than 100 nm thick, excessive amounts of photoresist may be present which may result in the pattern developed in the photoresist not being well defined and an unnecessary increase in the cost due to the use of excessive amounts of photoresist. Embodiments in accordance with the present disclosure are not limited to use on photoresist layers having a thickness or height ranging between about 20 to 100 nm. For example, embodiments in accordance with the present disclosure can be used with photoresist layers having a thickness less than 20 nm or greater than 100 nm.

In accordance with some embodiments of the present disclosure, methods and developer compositions in accordance with embodiments of the present disclosure are useful in patterning photoresists having pitches between exposed portions of the photoresist that are less than 60 nm or critical dimensions (CD) that are below 40 nm. When pitches between exposed portions of the photoresist are greater than 60 nm or CD greater than 40 nm, other developer solutions may provide adequate RLS tradeoffs. Embodiments in accordance with the present disclosure are not limited to patterning photoresists having pitches between exposed portions of the photoresist that are less than 60 nm or CD below 40 nm. For example, embodiments in accordance with the present disclosure are useful with photoresists having pitches between exposed portions of the photoresist that are greater than 60 nm or CD are greater than 40 nm.

In accordance with some embodiments, a benefit of utilizing a developer that includes a deprotonation agent of the present embodiments is reduced buildup of electrostatic charge on equipment that the developer flows across. It has been observed that developers that do not include a deprotonation agent of the present disclosure can induce a buildup of electrostatic charge on surfaces of equipment, e.g., metallic or electrically conductive surfaces, such as pumps and piping of photolithography equipment, as they flow across such surfaces. When such built up electrostatic charges are discharged, the equipment and/or devices on workpiece in the vicinity of the electrostatic discharge can be damaged. The presence of a deprotonation agent in a developer in accordance with the present disclosure will reduce the buildup of electrostatic charge on equipment surfaces as such developers flow across the same. The reduction in buildup of electrostatic charge will reduce the likelihood of a detrimental electrostatic discharge.

One aspect of this description relates to a lithography method that includes forming a resist layer over a workpiece. The resist layer is exposed to radiation. The exposed resist layer is then exposed to a developer that includes an organic solvent and a deprotonation agent. The developer removes an unexposed portion of the resist layer, thereby forming a patterned resist layer.

Another aspect of this description relates to a lithography method that includes forming a negative tone resist layer over a workpiece. The negative tone resist layer is exposed to extreme ultraviolet radiation. A surface of the negative tone resist layer exposed to the UV radiation is altered by contacting the portions of the negative tone resist layer exposed to the EUV radiation with a negative tone developer. The negative tone developer includes an organic solvent and a nitrogen-containing organic base. After the surface of the negative tone resist layer is altered, portions of the negative tone resist layer not exposed to the EUV radiation are removed, producing a patterned resist layer.

Another aspect of this description relates to a lithography developing composition that includes an organic solvent and a deprotonation agent. The developer when contacted with a negative tone resist layer which has been exposed to an electromagnetic radiation, causes a solubility of the exposed negative tone resist layer in the lithography developing composition to decrease.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method, comprising:

forming a resist layer comprising a negative resist including multiple carboxylate groups over a workpiece;

exposing a portion of the resist layer to radiation, the exposing converting at least some of the carboxylate groups in the exposed portion to carboxylic acid groups; and exposing the resist layer to a developer that removes an unexposed portion of the resist layer, thereby forming a patterned resist layer, wherein the developer includes a solvent consisting essentially of an ester acetate and a deprotonation agent configured to deprotonate one or more of the carboxylic acid groups in the exposed region, wherein the ester acetate derivative is represented by one of the following formulae (III) and (IV):

(III)

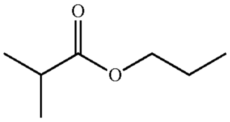

and (IV)

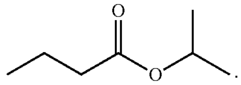

.

2. The lithography method of claim 1, further comprising deprotonating one or more of the carboxylic acid groups of the exposed resist layer.

3. The lithography method of claim 2, wherein the deprotonation agent has a pKa between 5 and 20.

4. The lithography method of claim 3, wherein the deprotonation agent is a nitrogen containing organic base.

5. The lithography method of claim 4, wherein the deprotonation agent is pyridine, imidazole, benzimidazole, methylamine, histidine or methylethyl amine.

6. The lithography method of claim 1, wherein the developer includes 10 wt % or more of the deprotonation agent.

7. The lithography method of claim 1, wherein the exposing the resist layer to a developer is carried out at a temperature between 20° C. to 30° C.

8. The lithography method of claim 1, wherein the exposing the resist layer to a developer is carried out for 5 to 300 seconds.

9. A lithography method, comprising:

forming a resist layer comprising a negative resist including multiple carboxylate groups over a workpiece;

exposing the resist layer to extreme ultraviolet (EUV) radiation, the exposing converting at least some of the carboxylate groups in the exposed portion to carboxylic acid groups;

altering a surface of a portion of the resist layer exposed to EUV radiation by contacting portions of the resist layer exposed to EUV radiation with a developer including a solvent consisting essentially of an ester acetate derivative and a nitrogen containing organic base configured to deprotonate one or more of the carboxylic acid groups in the exposed region, wherein the ester acetate derivative is represented by formula (I):

(I)

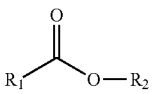

wherein:

(i) both $R_1$ and $R_2$ are n-propyl;

(ii) $R_1$ is n-propyl and $R_2$ is isopropyl; or (iii) $R_1$ is isopropyl and $R_2$ is n-propyl; and removing portions of the resist layer not exposed to EUV radiation.

10. The lithography method of claim 9, wherein the resist layer has a thickness of 20 to 100 nm.

11. The lithography method of claim 9, wherein the nitrogen containing organic base has a pKa between 5 and 20.

12. The lithography method of claim 9, wherein the altering a surface of the resist layer exposed to EUV radiation includes converting a —COOH group at the surface of the resist layer exposed to the EUV radiation to a $COO^-$ group.

13. The lithography method of claim 9, further comprising performing a baking process on the resist layer after the exposing.

14. The lithography method of claim 9, further comprising processing the workpiece using the patterned resist layer as a mask.

15. The lithography method of claim 9, wherein the nitrogen containing organic base is pyridine, imidazole, benzimidazole, methylamine, histidine or methylethyl amine.

16. The lithography method of claim 9, wherein a pitch between exposed portions of the resist layer is less than 60 nm.

17. A lithography developing composition including a solvent consisting essentially of an ester acetate derivative and a deprotonation agent which, when contacted with a resist layer comprising a negative resist including multiple carboxylate groups which has been exposed to an electromagnetic radiation, causes at least some of the carboxylate groups in exposed regions of the resist layer to be converted to carboxylic acid groups such that solubility of the exposed regions of the resist layer in the lithography developing composition to decreases, wherein the deprotonation agent is configured to deprotonate one or more of the carboxylic acid groups in the exposed regions of the resist layer, and wherein the ester acetate derivative is represented by formula (I):

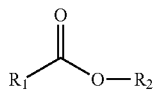

(I)

wherein:

(i) both $R_1$ and $R_2$ are n-propyl;

(ii) $R_1$ is n-propyl and $R_2$ is isopropyl; or (iii) $R_1$ is isopropyl and $R_2$ is n-propyl.

18. The lithography developing composition of claim 17, wherein the deprotonation agent is a nitrogen containing organic base having a pKa between 5 and 20.

19. The lithography developing composition of claim 18, the deprotonation agent is pyridine, imidazole, benzimidazole, methylamine, histidine or methylethyl amine.

20. The lithography developing composition of claim 17, wherein the deprotonation agent is soluble in the organic solvent.

* * * * *